United States Patent
Werner et al.

(10) Patent No.: US 6,649,974 B2
(45) Date of Patent: Nov. 18, 2003

(54) FIELD-EFFECT CONTROLLED SEMICONDUCTOR DEVICE HAVING A NON-OVERLAPPING GATE ELECTRODE AND DRIFT REGION AND ITS MANUFACTURING METHOD

(75) Inventors: Wolfgang Werner, München (DE); Franz Hirler, Isen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/175,593

(22) Filed: Jun. 19, 2002

(65) Prior Publication Data

US 2003/0025152 A1 Feb. 6, 2003

(30) Foreign Application Priority Data

Jun. 19, 2001 (DE) .......................................... 101 29 348

(51) Int. Cl.[7] .............................................. H01L 29/76
(52) U.S. Cl. ...................... 257/328; 257/357; 257/346; 257/371; 257/335; 257/328
(58) Field of Search ................................ 257/346, 371, 257/357, 335, 328

(56) References Cited

U.S. PATENT DOCUMENTS 4,543,596 A * 9/1985 Strack et al.
6,417,542 B2 * 7/2002 Werner

* cited by examiner

*Primary Examiner*—Fetsum Abraham
(74) *Attorney, Agent, or Firm*—Laurence A. Greenberg; Werner H. Stemer; Ralph E. Locher

(57) ABSTRACT

A semiconductor component includes a first connection zone of a first conductivity type for providing a contact at a first side of a semiconductor body and a second connection zone of the first conductivity type for providing a contact at the second side of the semiconductor body. A drift zone adjoins the first connection zone and extends in a vertical direction of the semiconductor body as far as the second side of the semiconductor body. A body zone of a second conductivity type is disposed between the second connection zone and the first connection zone or the drift zone. A control electrode is insulated from the semiconductor body and disposed above the body zone such that the control electrode substantially does not overlap with the drift zone and the second connection zone in a lateral direction. A method for manufacturing a semiconductor component is also provided.

19 Claims, 14 Drawing Sheets

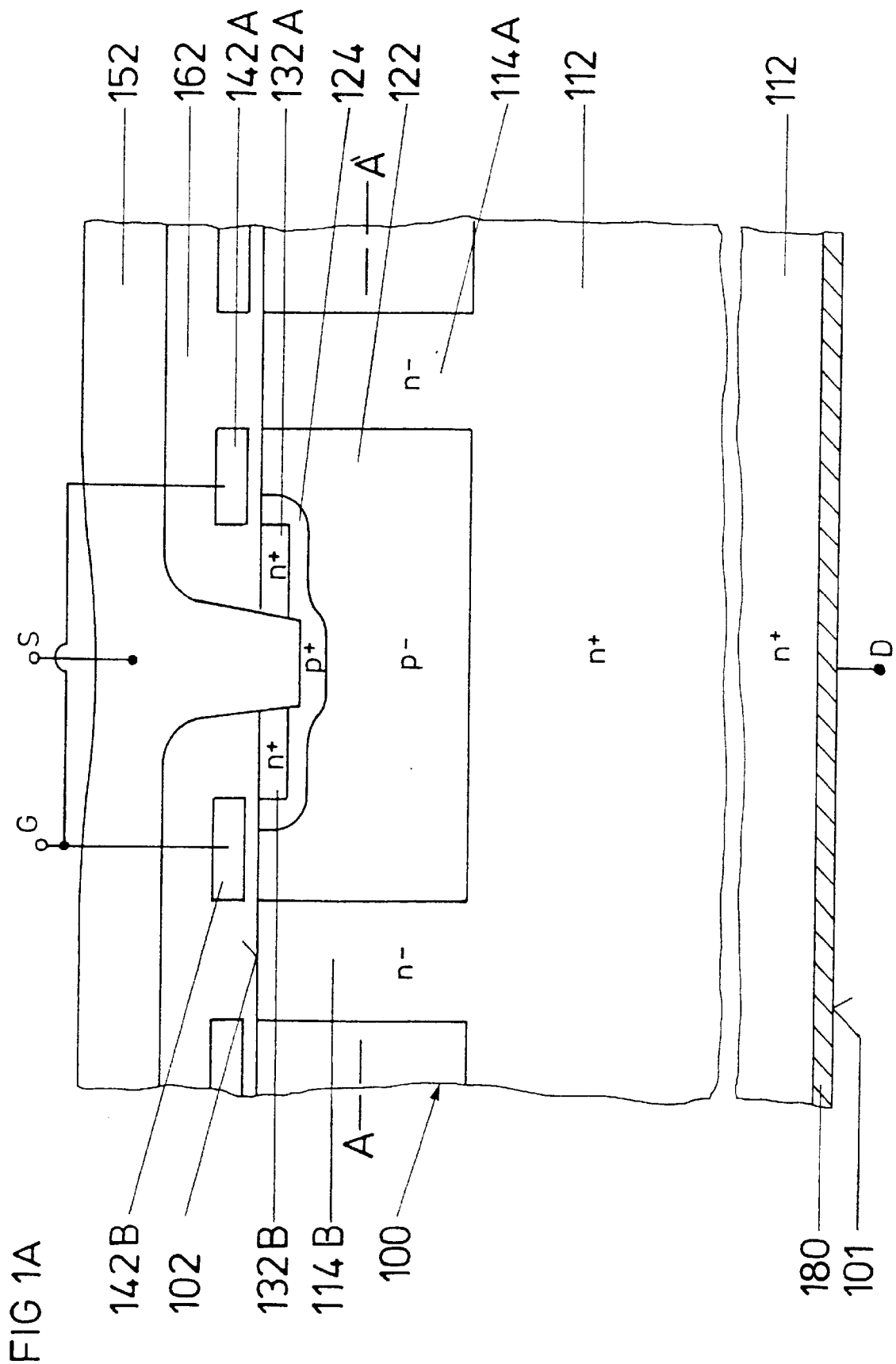

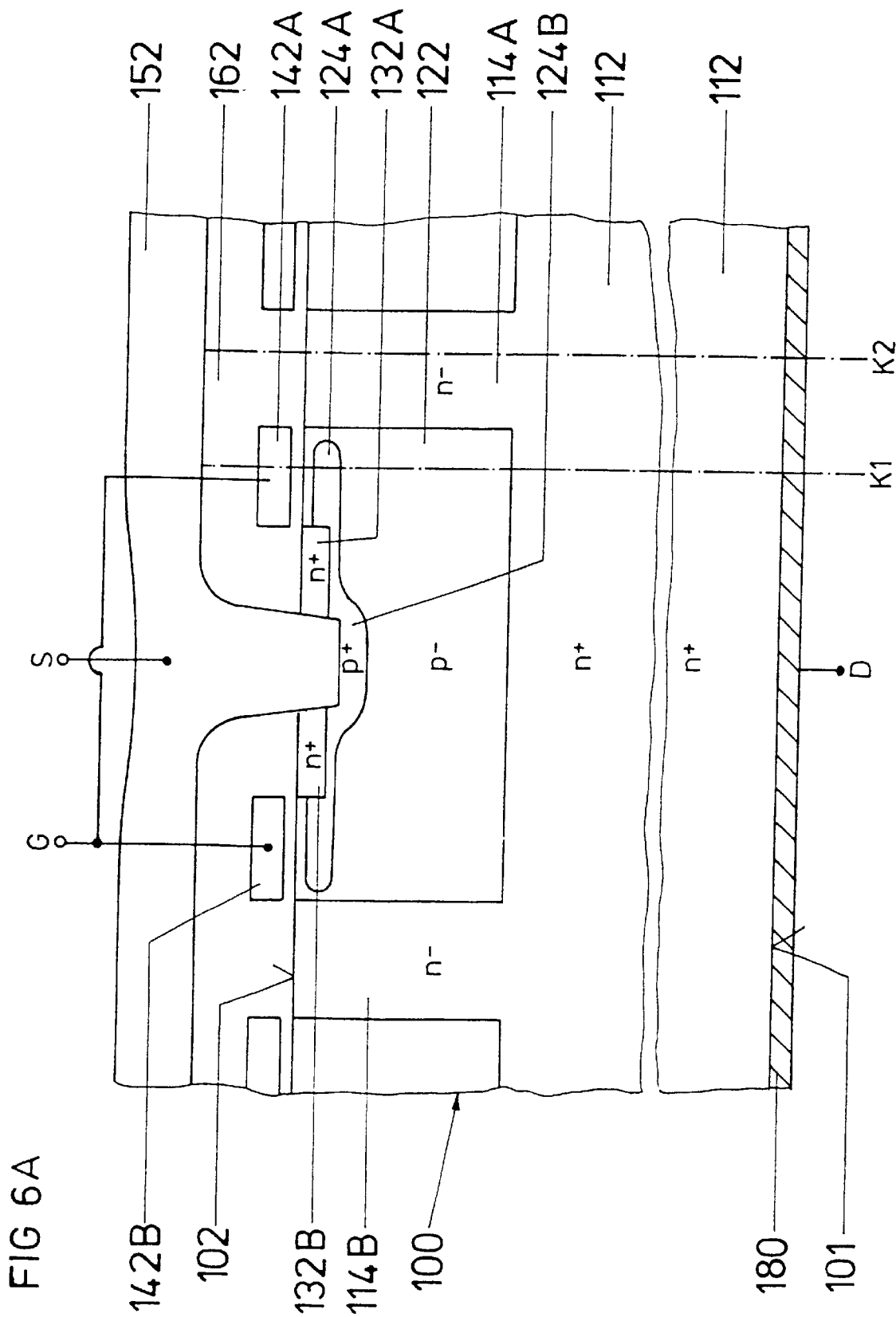

FIELD-EFFECT CONTROLLED SEMICONDUCTOR DEVICE HAVING A NON-OVERLAPPING GATE ELECTRODE AND DRIFT REGION AND ITS MANUFACTURING METHOD

BACKGROUND OF THE INVENTION

Field of the Invention

The invention relates to a field-effect controlled semiconductor component and to a method for manufacturing such a semiconductor component.

Such a component is for example a vertically configured field-effect transistor which is described, for example, by Stengl, Tihanyi in the book "Leistungs-MOSFET-Praxis" (Power MOSFET in practice), Pflaum Publishers, Munich, 1992, page 37. The field-effect transistor has a drain zone, as first connection zone, with which a contact can be provided on a rear side of the semiconductor body, and a second connection zone, as a source zone, with which a contact can be provided on a front side opposite the rear side. The source zone is formed in what is referred to as a body zone which is in turn formed in a drift zone above the drain zone. The drain zone, the source zone and the drift zone are of the same conductivity type, while the body zone is of a complementary conductivity type. The drift zone is weakly doped when compared to the drain zone and the source zone and, when a voltage is applied between the drain and source, it absorbs a large part of this voltage. Above the body zone, a control electrode is formed as a gate electrode which, when a suitable drive potential is applied, brings about a conductive channel in the body zone between the source zone and the drift zone. The gate electrode forms, with the region of the semiconductor body lying below it, a capacitor which has to be charged to switch through the transistor and discharged to switch off the transistor, and which thus influences the switching behavior of the transistor.

Such components are suitable, depending on their specific embodiments, for switching currents up to several tens of amperes with a dielectric strength of up to several hundred volts.

SUMMARY OF THE INVENTION

It is accordingly an object of the invention to provide a semiconductor component which overcomes the above-mentioned disadvantages of the heretofore-known semiconductor components of this general type and which in particular for applications in which voltages of less than 100 volts are to be switched or blocked, provides a low value for the gate capacitance.

With the foregoing and other objects in view there is provided, in accordance with the invention, a semiconductor component, including:

a semiconductor body having a first side and a second side opposite the first side, the semiconductor body defining a vertical direction and a lateral direction transverse to the vertical direction, the vertical direction extending from the first side to the second side;

the semiconductor body including a first connection zone of a first conductivity type for providing a contact at the first side of the semiconductor body;

the semiconductor body including a second connection zone of the first conductivity type for providing a contact at the second side of the semiconductor body;

the semiconductor body including a drift zone adjoining the first connection zone and extending in the vertical direction as far as the second side of the semiconductor body;

the semiconductor body including a body zone of a second conductivity type disposed between the second connection zone and the first connection zone or the drift zone; and a control electrode insulated from the semiconductor body, the control electrode being disposed above the body zone such that the control electrode substantially does not overlap with the drift zone and the second connection zone in the lateral direction.

According to another feature of the invention, the drift zone and the body zone have respective regions adjoining one another; and the respective regions are doped such that, when a reverse voltage is applied between the first connection zone and the second connection zone, at least the drift zone is completely emptied of charge carriers.

According to another feature of the invention, the body zone has a first zone with a first doping concentration of the second conductivity type and a second zone with a second doping concentration of the second conductivity type, the first doping concentration is higher than the second doping concentration; and the first zone adjoins the second connection zone and the second zone.

According to yet another feature of the invention, the body zone has a given zone of the second conductivity type, the given zone is disposed underneath the control electrode and at a given distance from the second side, the given zone of the second conductivity type is more heavily doped than a remainder of the body zone.

According to another feature of the invention, the drift zone has at least two adjacent zones, a first one of the at least two adjacent zones is of the first conductivity type and a second one of the at least two adjacent zones is of the second conductivity type; and the at least two adjacent zones extend from the first connection zone in the vertical direction of the semiconductor body toward the second side of the semiconductor body.

According to a further feature of the invention, the drift zone has a plurality of respectively alternating zones of the first and second conductivity types; and the plurality of respectively alternating zones extend from the first connection zone in the vertical direction of the semiconductor body toward the second side of the semiconductor body.

According to another feature of the invention, the at least two adjacent zones of the drift zone extend as elongated zones in the lateral direction of the semiconductor body.

According to another feature of the invention, the body zone, the second connection zone and the control electrode extend as elongated zones in a further lateral direction of the semiconductor body transverse to the lateral direction.

According to yet another feature of the invention, the drift zone has a given zone of the first conductivity type, the given zone is more heavily doped than a remainder of the drift zone, the given zone adjoins the body zone and is disposed at the second side of the semiconductor body.

The component according to the invention has a first connection zone of a first conductivity type, with which contact can be made on a first side of a semiconductor body, a second connection zone of the first conductivity type, with which contact can be made on a second side of the semiconductor body lying opposite the first side, a drift zone which adjoins the first connection zone and extends in the vertical direction of the semiconductor body as far as the second side of the semiconductor body, a body zone of a second conductivity type which is formed between the second connection zone and the drift zone, and a control electrode which is formed over the body zone and which is insulated from the semiconductor body. According to the invention, the control electrode is formed at least approximately without overlap with the drift zone and the second connection zone in the lateral direction of the semiconductor body. This results in a capacitance between the control electrode and the drift zone which is less than that of similar conventional components, that is to say a smaller gate/drain capacitance or Miller capacitance, as a result of which faster switching operations of the semiconductor component are possible.

Ideally, such semiconductor components have a small value for the product of the gate/drain capacitance and switch-on resistance, the switch-on resistance being the effective electrical resistance between the first and second connection zones when the control electrode is driven to the conductive state.

According to one embodiment of the invention, there is therefore provision that the regions of the body zone and of the drift zone which adjoin one another are doped in such a way that, when a voltage is applied between the first and second connection zones and the control electrode is not driven—that is to say when there is no conductive channel present in the body zone—at least the drift zone is completely emptied, i.e. completely drained of charge carriers. "Completely emptied" means that there are only the ionized non-moving impurity atoms present in the drift zone and no longer any freely moving charge carriers. The charge carriers of the drift zone are compensated by charge carriers of the body zone, resulting in a comparatively high breakdown voltage of the semiconductor component. On the other hand, as a result of the compensation of the charge carriers in the drift zone which occurs, the drift zone can be more heavily doped than in components without charge carrier compensation, resulting in a low switch-on resistance of the semiconductor component when there is a high breakdown voltage. The body zone preferably has a more heavily doped region around the first connection zone and a more weakly doped region adjacent to the drift zone, such that it is possible for the more weakly doped region to be emptied by the drift zone.

According to a further embodiment, in the body zone, a more heavily doped region is provided underneath the body zone, a more weakly doped region being present between the surface of the semiconductor body and this more heavily doped region in order to form a channel. The more heavily doped region prevents a space charge zone (depletion zone), which is produced when a voltage is applied between the first and second connection zones, from extending as far as the channel region underneath the control electrode in the body zone.

The product of the control electrode capacitance and switch-on resistance is smaller with the component according to this embodiment than with such components according to the prior art.

In a further embodiment of the invention, the drift zone has a number of alternating zones of the first and second conductivity types, which zones extend in each case in the vertical direction of the semiconductor body toward the second side of the semiconductor body starting from the first connection zone. These respectively alternating zones with different conductivity types are doped here in such a way that, when a voltage is applied between the first and second connection zones and the drive electrode is not driven, they empty one another, or that at least the zones of one conductivity type are completely emptied.

These differently doped zones of the drift zone additionally extend in elongated fashion in a first lateral direction of the semiconductor body, the body zone which is formed in the drift zone, the second connection zone and the associated control electrode extending in elongated fashion in a second lateral direction of the semiconductor body transversely with respect to the first lateral direction.

In this embodiment of the invention, the switch-on resistance, which is mainly dependent on the doping of the alternating zones in the drift zone, can be set independently of the resistance of the channel in the body zone, which resistance is dependent not only on the doping of the body zone but also on the channel length.

The drift zone preferably has, adjacent to the body zone, a heavily doped, also elongated zone of the first conductivity type in order to "collect" charge carriers of the first conductivity type which leave the channel zone, and to pass the charge carriers on to the first connection zone of the first conductivity type via the zones of the first conductivity type in the drift zone.

With the objects of the invention in view there is also provided, a method for manufacturing a semiconductor component, the method includes the steps of:

providing a semiconductor substrate of a first conductivity type in order to provide a first connection zone;

forming a layer of a second conductivity type on the semiconductor substrate;

manufacturing at least one plate-shaped control electrode on the layer of the second conductivity type such that the at least one plate-shaped control electrode is insulated from the layer of the second conductivity type;

manufacturing a drift zone of the first conductivity type such that, at least in a region of a surface of the layer of the second conductivity type, the drift zone is directly or indirectly self-aligned with respect to a first edge of the at least one plate-shaped control electrode and such that the drift zone extends in a vertical direction of a semiconductor body as far as the semiconductor substrate; and manufacturing a second connection zone of the first conductivity type in the layer of the second conductivity type such that, at least in a region of a surface of the layer of the second conductivity type, the second connection zone is self-aligned with respect to a second edge of the at least one plate-shaped control electrode disposed opposite the first edge.

Another mode of the method according to the invention includes manufacturing a spacer at a side of the first edge of the at least one plate-shaped control electrode for manufacturing the drift zone; and manufacturing the drift zone self-aligning with respect to the spacer in a region of the layer of the second conductivity type, the region adjoining a surface of the layer.

A further mode of the method according to the invention includes, prior to manufacturing the second connection zone, producing a doped zone of the second conductivity type in the layer of the second conductivity type, such that the doped zone is more heavily doped than a remainder of the layer of the second conductivity type.

Another mode of the method according to the invention includes producing the doped zone by diffusing doping atoms of the second conductivity type into the layer of the second conductivity type.

Yet another mode of the method according to the invention includes manufacturing the drift zone by implanting doping atoms of the first conductivity type into the layer of the second conductivity type.

Another mode of the method according to the invention includes manufacturing the second connection zone by implanting doping atoms of the first conductivity type into the doped zone of the layer of the second conductivity type.

With the objects of the invention in view there is also provided, a method for manufacturing a semiconductor component, the method includes the steps of:

providing a semiconductor substrate of a first conductivity type in order to provide a first connection zone;

applying a layer onto the semiconductor substrate such that the layer has a given conductivity type selected from the group consisting of the first conductivity type and a second conductivity type;

manufacturing compensation zones in the layer such that the compensation zones have a conductivity type complementary to the given conductivity type of the layer and such that the compensation zones extend as far as the semiconductor substrate;

manufacturing at least one control electrode on the layer such that the at least one control electrode is insulated from the layer;

manufacturing a body zone of the second conductivity type in the layer underneath the at least one control electrode;

manufacturing a second connection zone of the first conductivity type in the body zone such that the second connection zone is directly or indirectly self-aligned with respect to a first edge of the at least one control electrode, at least in a region of a surface of the layer; and manufacturing a self-aligned zone of the first conductivity type in the layer such that the self-aligned zone is self aligned with respect to a second edge opposite the first edge of the at least one control electrode, at least in a region of a surface of the layer.

Another mode of the method according to the invention includes manufacturing the body zone by using a diffusion method.

Another mode of the method according to the invention includes manufacturing the second connection zone by using an ion implantation process.

A further mode of the method according to the invention includes manufacturing the self-aligned zone by using an ion implantation process.

Other features which are considered as characteristic for the invention are set forth in the appended claims.

Although the invention is illustrated and described herein as embodied in a semiconductor component which can be controlled through the use of a field-effect and a method for manufacturing such a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1a and 1b are diagrammatic partial sectional views of a first exemplary embodiment of a semiconductor component according to the invention;

FIG. 6a is a diagrammatic partial sectional view of a further exemplary embodiment of a semiconductor component according to the invention; and FIGS. 6b and 6c are graphs for illustrating the profiles of the doping concentrations along two curves extending in the vertical direction through the body zone and, respectively, through the drift zone of the semiconductor component shown in FIG. 6a.

DESCRIPTION OF THE PREFERRED EMBODIMENTS:

The invention is explained below with reference to an n-type conducting field-effect transistor having a gate G, a source S and a drain D. Unless otherwise stated, same reference symbols designate corresponding elements in the figures. Regions of the first conductivity type are formed here as n-type conducting regions and regions of the second conductivity type as p-type conducting regions. It goes without saying that the invention is not restricted to an n-type conducting component. A corresponding p-type conducting component is obtained by replacing the regions which are n-type conducting below by p-type conducting regions, and the regions which are p-type conducting below by n-type conducting regions.

The first connection zone of the component according to the invention is formed in the exemplary embodiments by the drain zone of the transistor, the second connection zone is formed by the source zone of the transistor and the control electrode is formed by the gate electrode of the transistor.

Figure 1B:
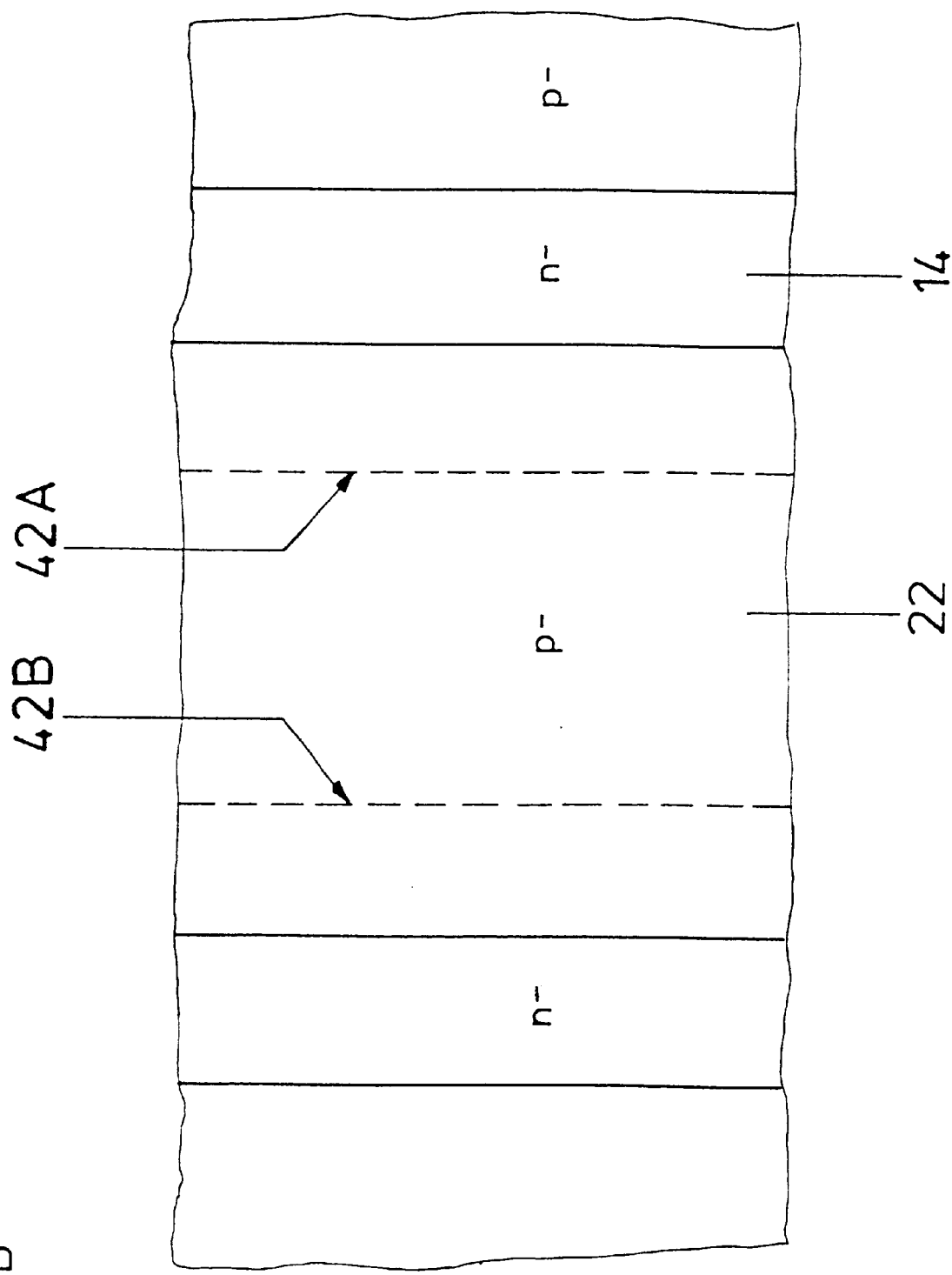

FIG. 1a shows a first exemplary embodiment of a semiconductor component according to the invention which is embodied as an MOS (Metal Oxide Semiconductor) transistor, the component being represented in FIG. 1a in a cross-sectional side view, and in FIG. 1b in a cross section through a sectional plane A–A' which is shown in FIG. 1a. FIG. 1b illustrates a drift zone 14, a body zone 22 wherein the edges of gate electrodes 42a, 42b located above the body zone 22 are indicated by dashed lines.

The semiconductor component according to the invention has a heavily doped drain zone 112, which is formed for example by a semiconductor substrate. Contact is made with the drain zone 112 through the use of a contact layer 180, for example made of metal, on a rear side 101 of a semiconductor body 100 in which the drain zone 112 is formed. The contact layer forms a drain terminal, which is shown schematically in FIG. 1a and designated by the reference character D.

The drain zone 112 is adjoined by a p-type doped body zone 122, 124 in which a heavily n-type doped source zone 132A, 132B is formed. The source zone 132A, 132B, is contacted from a front side of the semiconductor body 100 through the use of a source contact 152. The source contact extends in the vertical direction of the semiconductor body 100 as far as the body zone in order to short-circuit the source zone 132A, 132B and the body zone 122, 124. The body zone has a heavily p-type doped zone 124, which is formed around the source zone 132A, 132B and the section of the source zone 152 which extends into the body zone. In particular in the region of the source contact 152, this heavily doped zone 124 extends further in the vertical direction of the semiconductor body 100 than in the region of the source zone 132A, 132B. The rest of the region 122 of the body zone which adjoins the drain zone 112 is weakly p-type doped.

FIG. 1a shows source zones 132A, 132B, which are provided symmetrically with respect to the source contact. These source zones 132A, 132B are each components of a cell of the transistor, the transistor having a plurality of cells which have identical structures and are driven jointly. The source zones of all the cells are, for this purpose, jointly connected to the source contact 152. Body zones of further transistor cells are indicated on the left and right edges of the detail illustrated in FIG. 1a. The drain zone 112 is common to all the zones.

The semiconductor component also has a drift zone 114A, 114B, which, starting from the drain zone 112, extends in the vertical direction of the semiconductor body 100 adjacent to the body zone 122, or between two body zones, as far as a front side 102 of the semiconductor body 100, two drift zones 114A, 114B, being represented in FIG. 1a. The drift zones are more weakly doped than the drain zone 112.

Gate electrodes 142A, 142B which are assigned to each of the source zones 132A, 132B are formed above the body zone 122, 124, insulated from the semiconductor body 100 through the use of an insulation layer 162. These gate electrodes 132A, 132B are each formed in such a way that in the region of the first edge they are formed at least approximately without overlap with the associated source zone 132A, 132B, so that they therefore do not overlap the source zones 132A, 132B in the lateral direction of the semiconductor body. The gate electrodes are also formed without overlap with the drift zones 114A, 114B in the region of an edge extending opposite the first edge. The dimensions of the gate electrodes 142A, 142B are just sufficient in the lateral direction of the semiconductor body that conductive channels can be formed between the source zones 132A, 132B and the drift zone 114A, 114B when a suitable drive potential is applied to the gate electrodes 142A, 142B. By avoiding an overlap between the gate electrodes 142A, 142B, the dimensions of the gate electrodes 142A, 142B are kept to a minimum while being adapted to the length of the channel, as a result of which in particular a gate/drain capacitance formed between the gate electrodes and the drift zone is minimal.

The doping of the more weakly doped region 122 of the body zone and the doping of the drift zones 114A, 114B which are provided adjacent to the more weakly doped region 122 are matched to one another in such a way that the drift zones 114A, 114B and the weakly doped region 122 of the body zone empty one another if a voltage is applied between the source terminal 152 (S) and the drain terminal D and there is no drive potential applied to the gate electrodes 142A, 142B; that is to say if the field-effect transistor is turned off. The body zone 122, 124, the source zones 132A, 132B and the associated gate electrodes 142A, 142B are preferably formed elongated in a lateral direction which extends perpendicular to the plane of the drawing in FIG. 1a, as is apparent in particular from the cross section in the sectional plane A–A', illustrated in FIG. 1b.

The structure illustrated in FIG. 1a with the body zone 122, 124, the source zones 132A, 132B, the drift zones 114A, 114B and the gate electrodes 142A, 142B is preferably repeated a number of times to the right and left in order to form a semiconductor component with a plurality of transistor cells which have an identical structure. These transistor cells are connected in parallel. These transistor cells also have a common drain zone, which is formed in the present case by the substrate 112, and a common source terminal 152 which makes contact with the source zones of all the transistor cells. FIG. 1a shows further respective body zones with control electrodes lying above them on the right and left edges of the detail illustrated. It is apparent from this that the drift zones 114A, 114B are each provided between two body zones, these body zones and the intermediate drift zones emptying one another when a blocking voltage is applied.

The length of the drift zones 114A, 114B in the vertical direction of the semiconductor body, or the height of the body zone 122, is preferably approximately 1 $\mu$m. The length of the gate electrodes 142A, 142B in the lateral direction between the source zones 132A, 132B and the drift zones 114A, 114B is preferably approximately 0.25 $\mu$m.

The regions of the body zone 122 and of the drift zones which empty one another preferably each have an area doping of approximately $2 \cdot 10^{12}$ cm$^{-3}$. The doping of the more heavily p-type doped region 124 of the body zone is approximately $10^{16}$–$10^{17}$ cm$^{-3}$. The width of this zone 124 underneath the gate electrodes 142A, 142B is preferably approximately 0.25 $\mu$m.

Figure 2A:
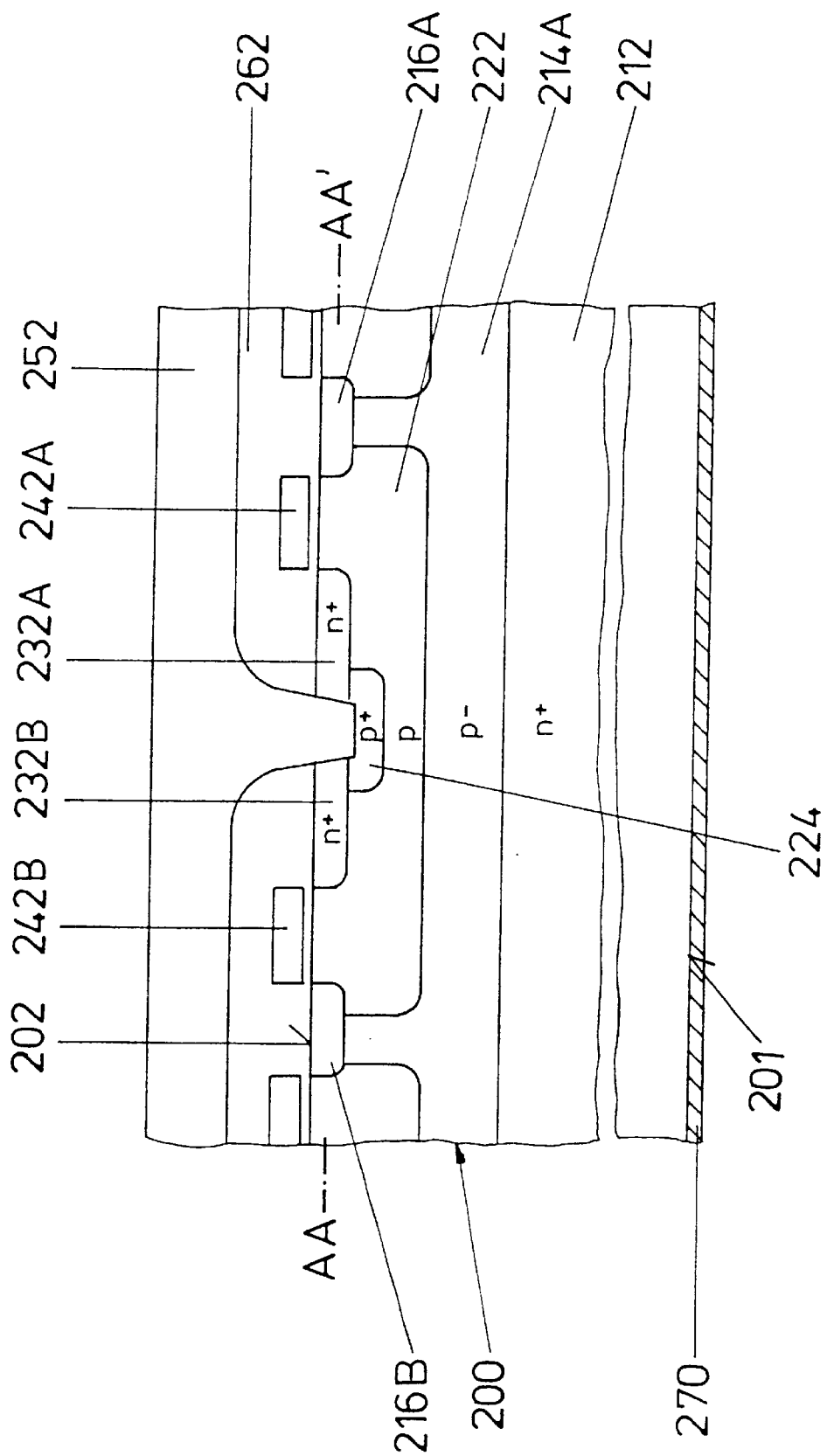
FIGS. 2a to 2c are diagrammatic partial sectional views of a second exemplary embodiment of a semiconductor component according to the invention.
Figure 2B:
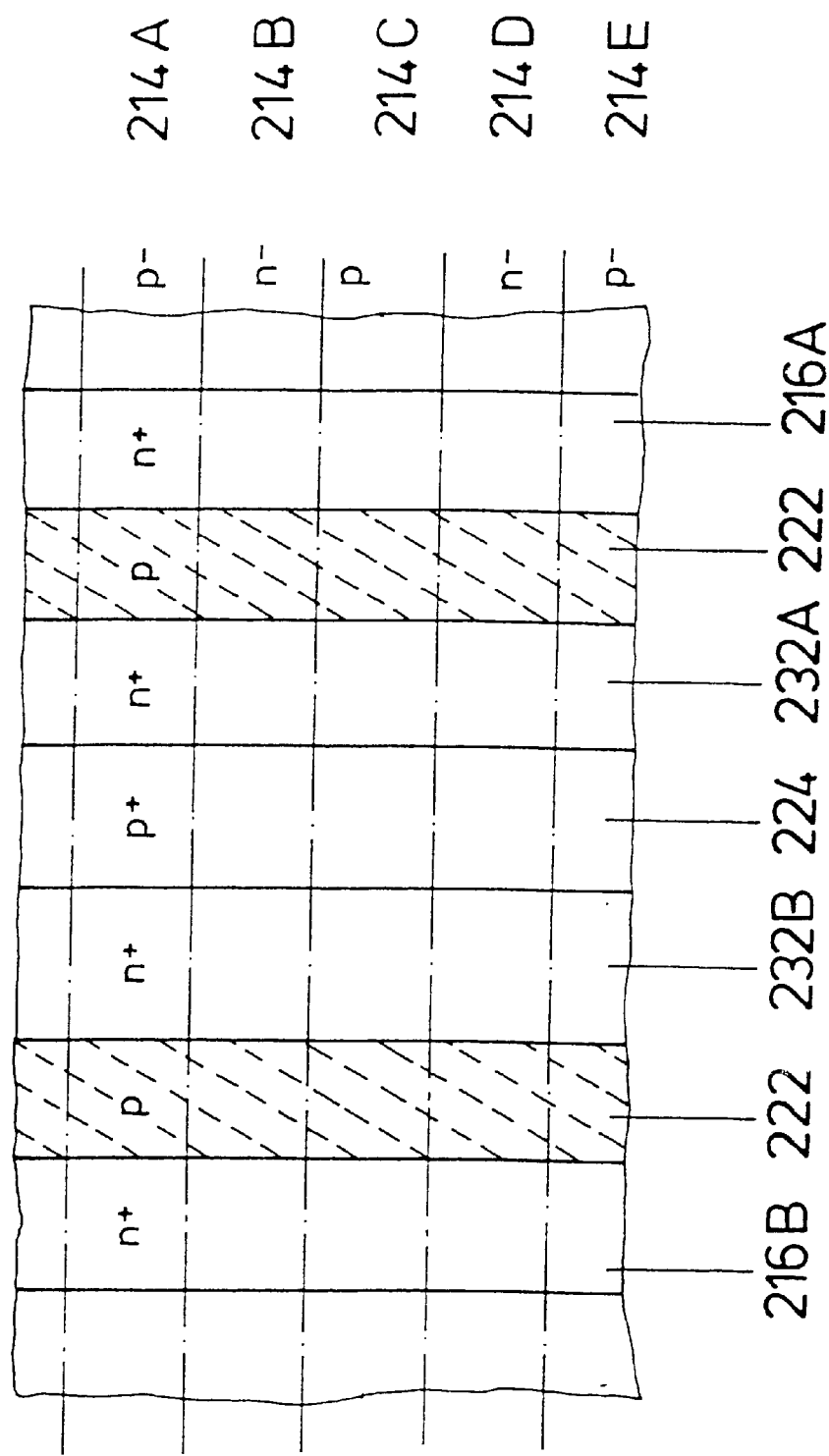
Figure 2C:
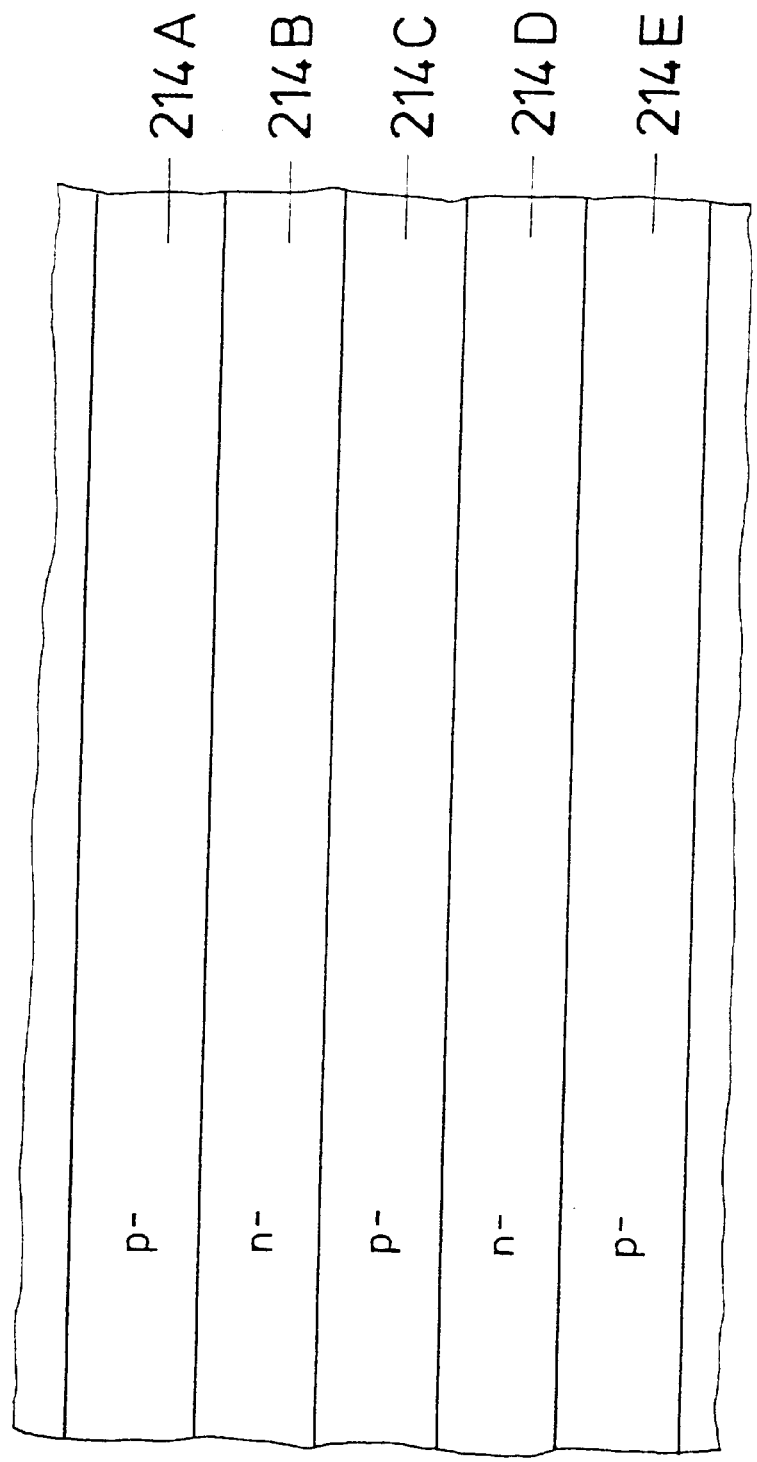

FIG. 2a shows a further exemplary embodiment of a semiconductor component according to the invention, the component being represented in FIG. 2a in a cross-sectional side view and in FIG. 2b in cross section through a sectional plane AA-AA' shown in FIG. 2a, and in FIG. 2c in a cross section that illustrates layers 214A–214E.

The semiconductor component according to the invention has a heavily n-doped drain zone 212, with which contact is made on a rear side 201 of the semiconductor body 200 through the use of a contact layer 270. A drift zone 214A, 214B, 214C, 214D, 214E is provided over the drain zone and, as is apparent in particular from FIG. 2c, has a plurality of respectively complementary doped zones 214A–214E provided one next to the other. These complementarily doped 214A–214E each extend in elongated fashion one next to the other in the lateral direction of the semiconductor body 200.

A p-type doped body zone 222 is formed in the drift zone 214, the body zone 222 extending in an elongated fashion in a lateral direction of the semiconductor body transversely with respect to the extent of the differently doped zones 214A–214E of the drift zone 214. The lateral direction in which the body zone 222 extends in elongated fashion extends perpendicularly to the plane of the drawing in FIG. 2a.

A heavily n-type doped source zone 232A, 232B is formed in the body zone 222, two such source zones being represented in FIG. 2a. The source zone 232A, 232B also extends in elongated fashion in the same lateral direction as the body zone. Contact is made with the source zones 232A, 232B through the use of a source contact 252 from a front side 202 of the semiconductor body 200 in which the drain zone 212, the drift zone 214, the body zone 222 and the source zones 232A, 232B are formed. This source contact 252 is preferably composed of a metal, for example aluminum, and extends in the vertical direction of the semiconductor body 200 as far as the body zone 222 in order to short-circuit the source zones 232A, 232B and the body zone 222. The region of the source contact 252 which extends into the body zone 222 is surrounded by a heavily p-type doped zone 224.

In the exemplary embodiment, the drift zone 214 has heavily n-type doped zones 216A, 216B which adjoin the body zone 222 on both sides and which extend parallel to the body zone 222 and transversely with respect to the complementary zones 214A–214E.

Plate-shaped gate electrodes 242A, 242B are each formed in the insulation layer 262 without overlap with the source zones 232A, 232B in the region of a first edge, and without overlap with the more heavily doped region 216A, 216B of the drift zone in the region of a second edge lying opposite the first edge.

When a drive potential is applied to the gate electrodes 242A, 242B, conductive channels are formed between the source zones 232A, 232B and the more heavily doped zones 216A, 216B of the drift zone 214A–214E in the body zone 222 underneath the gate electrodes 242A, 242B. The configuration of the gate electrodes 242A, 242B which is without overlap with the source zones 232A, 232B minimizes the area of the gate electrodes 242A, 242B, and thus the gate capacitance of the component, which is composed of the sum of the individual capacitances formed between the gate electrodes 142A, 242B and the semiconductor body 200. The switch-on resistance of the semiconductor component, i.e. the effective resistance between the source terminal S and drain terminal D when the gate electrodes 242A, 242B are driven is dependent on the doping of the complementarily doped zones 214A–214E of the drift zone.

In the exemplary embodiment according to FIG. 2a, this switch-on resistance can be set independently of a resistance of the channel, the resistance of the channel being dependent on the length of the channel, i.e. the lateral distance between the source zones 232A, 232B and the drift zone 216A, 216B and the doping of the body zone 222.

The semiconductor component according to FIG. 2a is also composed of a plurality of transistor cells with an identical structure. The body zones and gate electrodes of respectively adjacent transistor cells are represented in FIG. 2a on the right and left edges of the detail. As is also the case in the exemplary embodiment according to FIG. 1, the individual transistor cells are symmetrical with respect to the section of the source contact 252 which extends into the semiconductor body. In addition to embodiments represented in FIGS. 1a and 2a in which the body zones, the source zones and the control electrodes are formed in elongated fashion, it is also possible to form body zones which are rectangular or round in plan view and which are each completely surrounded by drift zones, the source zone and the gate electrode being accordingly formed in a closed annular shape about a section of a source contact which extends into the semiconductor body.

A method of manufacturing a semiconductor component according to the invention in accordance with the exemplary embodiment illustrated in FIG. 1a is explained below with reference to FIGS. 3a–3d, in which the semiconductor component according to the invention is represented in a cross-sectional side view during various method steps of a manufacturing method.

Figure 3A:
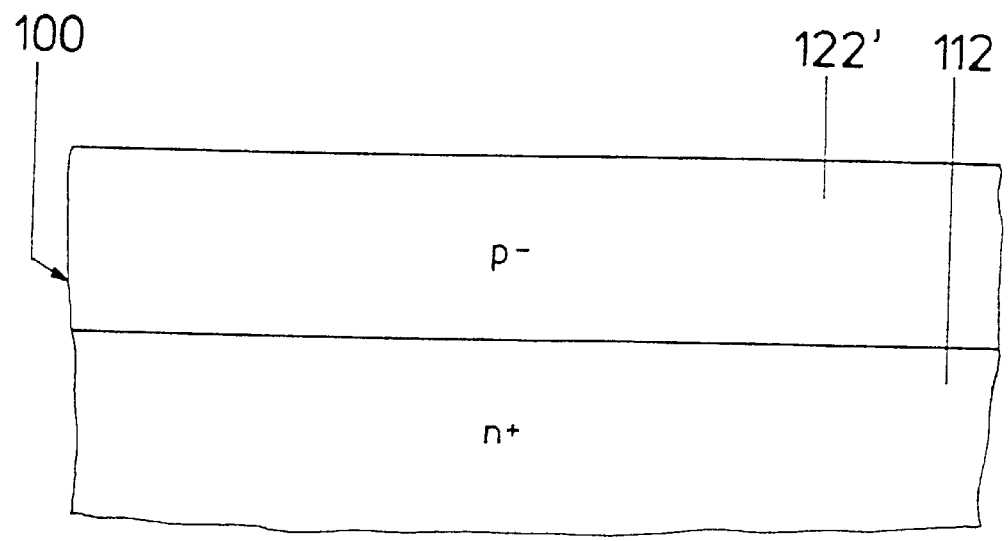
FIGS. 3a to 3d are diagrammatic partial sectional views of a semiconductor component according to FIG. 1a during various method steps of a manufacturing method according to the invention.

The method according to the invention provides for a heavily n-type doped semiconductor substrate 112, the later drain zone, to be prepared and for a p-type doped layer 122', the later body zone, to be applied onto this semiconductor substrate, for example through the use of epitaxy. The result of these first method steps are illustrated in FIG. 3a.

Figure 3B:
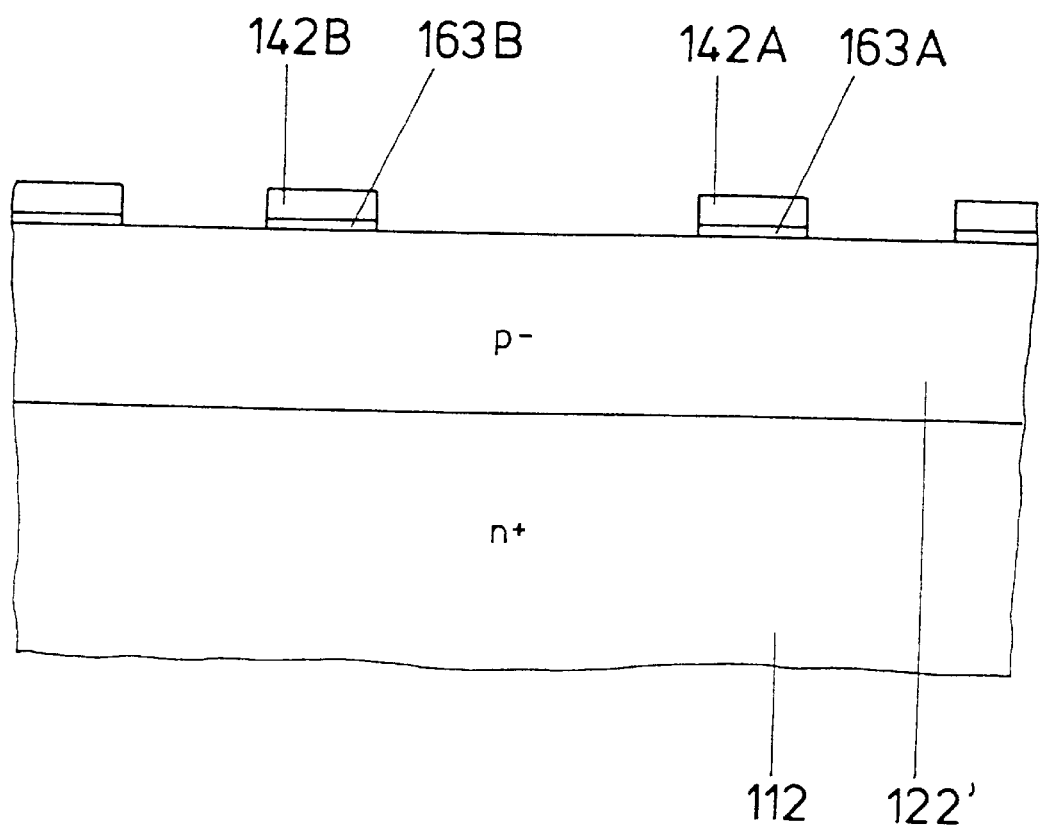

In the next method steps, at least one gate electrode 142A, 142B, which is insulated from the p-type doped layer 122' through the use of an insulation layer 163A, 163B, is formed on the layer 122' whose surface forms the front side of a semiconductor body 100 which is composed of the substrate 112 and the layer 122'. The gate electrodes 142A, 142B and the insulation layers 163A, 163B which insulate the gate electrodes 142A, 142B are manufactured through the use of conventional methods. The result of these method steps is illustrated in FIG. 3b, which shows two gate electrodes 142A, 142B. The gate electrodes 142A, 142B are preferably composed of metal or polysilicon, and the insulation layer 163A, 163B is usually composed of a layer made of a semiconductor oxide.

Figure 3C:
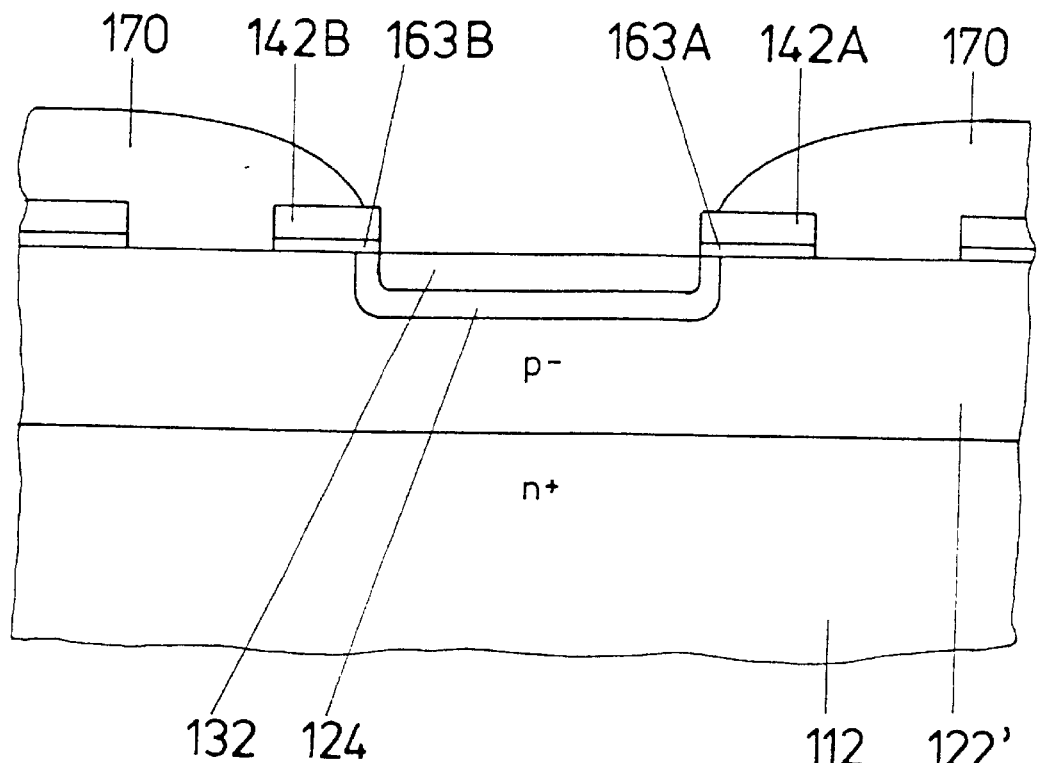

In the next method steps, whose result is illustrated in FIG. 3c, the later source zones and a more heavily p-type doped region 124 which surrounds these source zones are manufactured. For this purpose, a protective layer 170 is applied to the semiconductor body, which leaves the regions of the layer 122' free in the upward direction in which the source zones are to be manufactured. Then, a more heavily n-type zone 132 is produced, preferably through the use of ion implantation and with self-alignment with the gate electrode 142A, 142B. The edge of the control electrode 142A, 142B with which the source zone 132 is to be produced with self-alignment is not covered here by the protective layer 170.

Before the implantation of the source zone 132, the more heavily p-type zone 124 is manufactured, this being carried out, for example, through the use of a diffusion method.

Figure 3D:
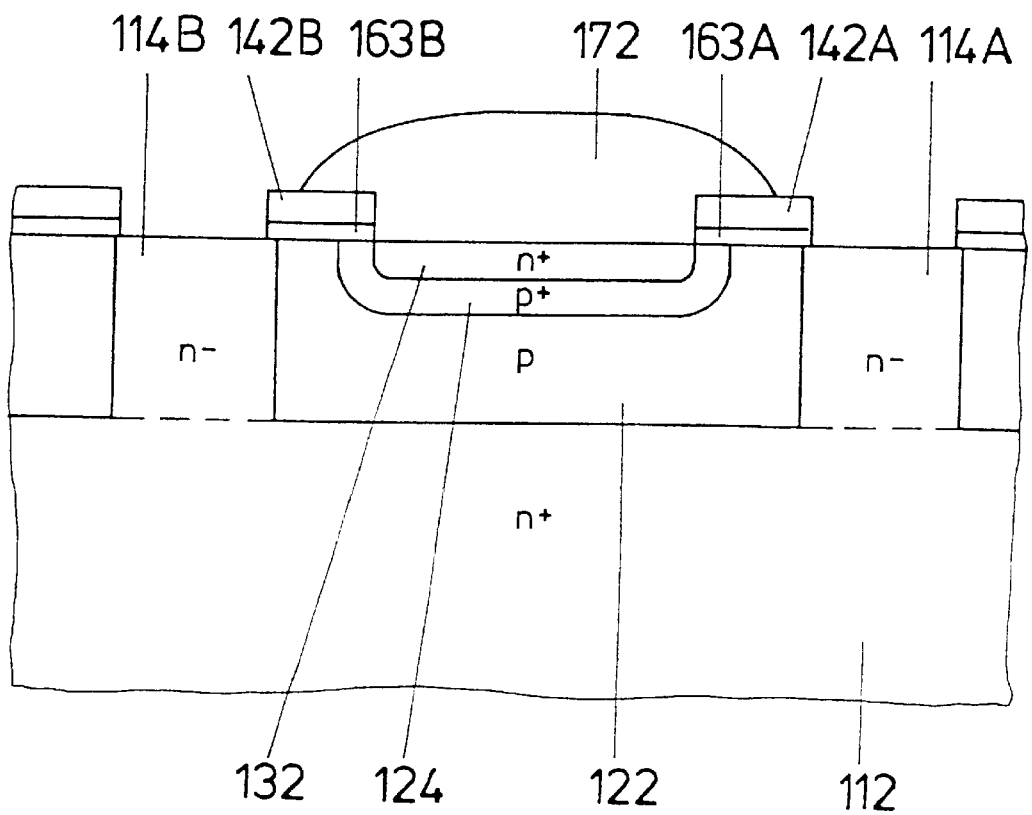

In the next method steps, whose result is illustrated in FIG. 3d, the drift zone 114A, 114B which extends from the front side of the semiconductor body into the drain zone 112 is manufactured. For this purpose, the protective layer 170 is first removed and a new protective layer 172 is applied, the new protective layer 172 covering the source zone 132 and leaving free the edge of the gate electrode 142A, 142B which lies opposite the edge with which the source zone 132 was manufactured with self-alignment. The drift zone 114A, 114B is preferably produced through the use of ion implantation into the p-type doped layer 122', the p-type doped layer 122' being re-doped in the regions which are exposed to the ion implantation, in order, in this way, to produce p-type body zones 122, which are each separated from one another by the n-type doped drift zones 114A, 114B.

The gate electrode 142A, 142B in FIG. 3c masks the semiconductor body during the ion implantation in order to manufacture the drift zone 114A 114B. In order to prevent ions passing, during the implantation process, into the body zone 122 through the gate electrode 142A, 142B and in the insulation layer 163A, 163B lying underneath, the gate electrode 142A, 142B must have an adequate thickness, or a hard mask or a photoresist mask is applied to the gate electrode 142A, 142B in order to prevent implantation into the semiconductor body through the gate electrode 142A, 142B.

After the removal of the protective layer 172, a contact hole is produced in the semiconductor body 100, which hole extends through the source zone 132 as far as into the heavily doped region 124 of the body zone. Then, the source contact 152 is manufactured insulated from the control electrode 142A, 142B in a generally known fashion. Before the manufacture of the source contact 152, p-type doping can be performed at the bottom of the contact hole in order, as illustrated in FIG. 1a, to surround the section of the source contact 152 which extends into the semiconductor body with a sufficiently thick, heavily p-type zone 124.

During the manufacture of the drift zone using the gate electrode 142A, 142B as mask, there is unavoidably a small degree of underdiffusion of n-type doped atoms under the gate electrode 142A, 142B, resulting in a slight degree of overlap of the gate electrode 142A, 142B over the drift zone.

Figure 4A:
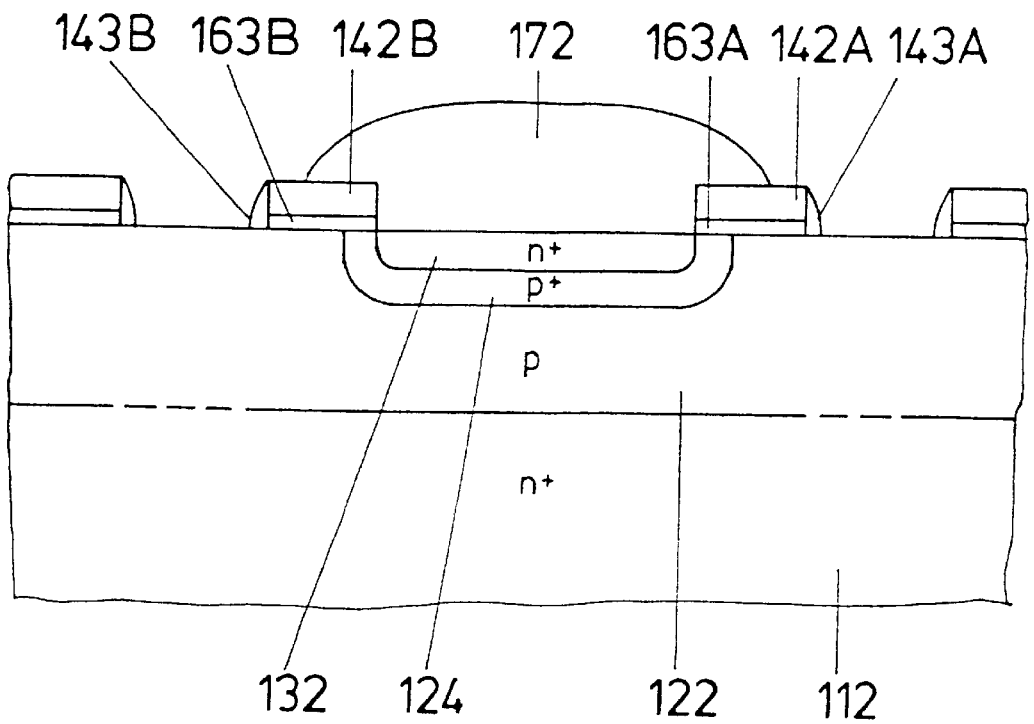
FIGS. 4a and 4b are diagrammatic partial sectional views of a semiconductor component according to FIG. 1a during various method steps of a manufacturing method which is modified with respect to the steps shown in FIGS. 3a to 3d.
Figure 4B:
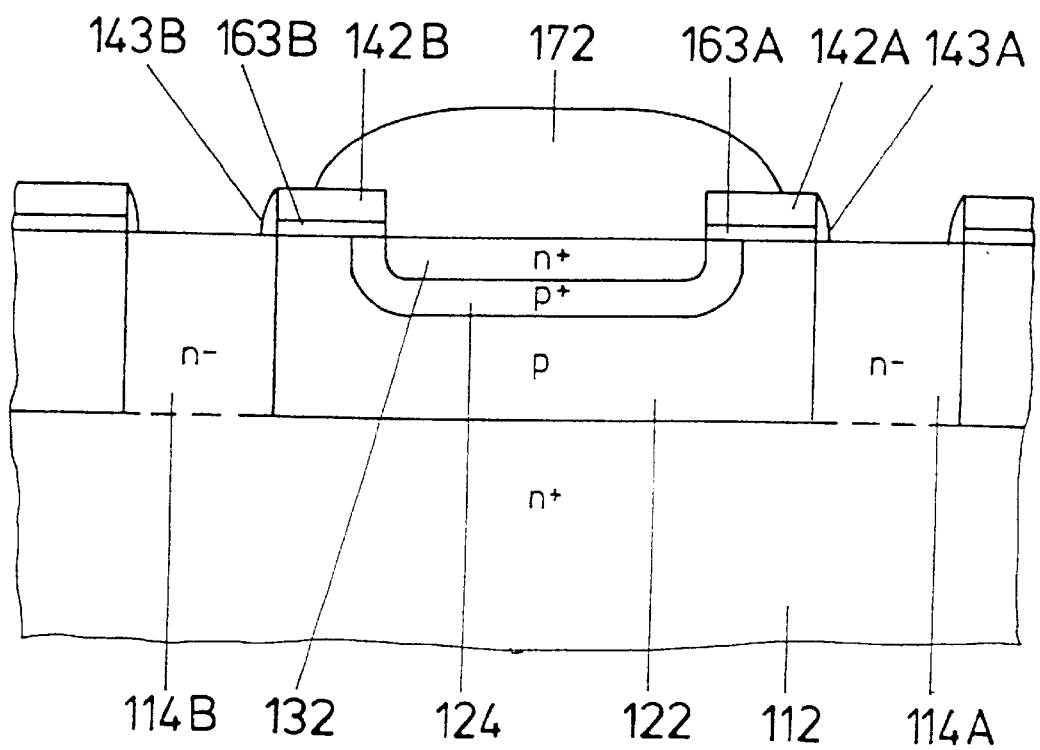

In order to avoid this overlapping, there is provision in one embodiment of a method according to the invention that, before the implantation of the n-type doping atoms to manufacture the drift zone 114A, 114B, spacers 143A, 143B are manufactured to the side of the gate electrodes 142A, 142B, as illustrated in FIG. 4a which shows the configuration after the manufacture of the spacers 143A, 143B and before the implantation step. During the implantation step, there is unavoidably underdiffusion of the spacers 143A, 143B. It is possible to use the lateral extent of the spacers as a function of the measure of the underdiffusion to adjust how far the drift 114A, 114B extends underneath the gate electrode 142A, 142B, there being preferably only a minimum degree of overlap, or even no overlap at all, between the gate electrode 142A, 142B and the drift zone 114A, 114B.

The drift zone 114A, 114B is manufactured without using a spacer, with direct self alignment with the gate electrode 142A, 142B and using a spacer which prescribes the distance from the gate electrode 142A, 142B, with indirect self alignment with respect to the gate electrode 142A, 142B.

The spacer 143A, 143B is manufactured, for example, by depositing a mask layer, which is subsequently anisotropically etched until the spacer 143A, 143B is left on the exposed edge of the gate electrode 142A, 142B.

The self-aligned manufacture of the drift zone 114A, 114B with respect to an edge of the gate electrode 142A, 142B or the self-aligned manufacture of the source zone 132 with respect to the other edge of the gate electrode 142A, 142B is carried out in such a way that the drift zone 114A, 114B or the source zone 132 is directly or indirectly self aligned with respect to the gate electrode 142A, 142B at least in a region underneath the surface of the layer 122' in which a conductive channel is formed when a control voltage is applied.

A method for manufacturing semiconductor components according to FIG. 2a will now be explained with reference to FIGS. 5a to 5h.

The method firstly provides for a heavily n-type doped semiconductor substrate 212 to be made available and a more weakly n-type doped or a more weakly p-type doped layer 214 to be applied to the semiconductor substrate 212, the layer being n-type doped in the exemplary embodiment according to FIG. 1a.

In the next method steps a strip-shaped protective layer 270 is applied to the surface of the preferably epitaxial layer 214, and the layer 214 is "redoped" in the regions which are exposed by the protective layer 270. This redoping is preferably carried out through the use of ion implantation into the layer 214. This ion implantation can be carried out in a plurality of steps, the result of these implantation steps being adjacent, respectively complementarily doped zones 214A–214E which extend in strip shapes and which each extend from the semiconductor substrate 212 as far as the surface of a semiconductor body 200 which is formed by the substrate 212 and the layer 214. In the example according to FIGS. 5a to 5h, an n-type doped epitaxial layer 214 is assumed so that ions which provide p-type charge carriers are implanted. In the opposite case (not illustrated), in which the epitaxial layer applied to the semiconductor substrate is p-type doped, n-type doped zones would be correspondingly produced through the use of ion implantation.

Figure 5A:
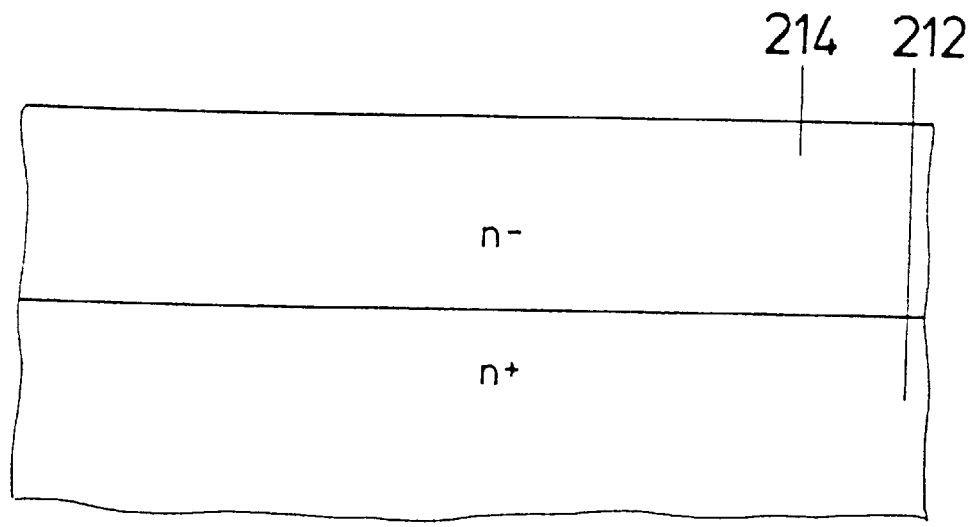
FIGS. 5a to 5h are diagrammatic partial sectional views of a semiconductor component according to FIG. 2a during various method steps of a manufacturing method according to the invention.
Figure 5B:
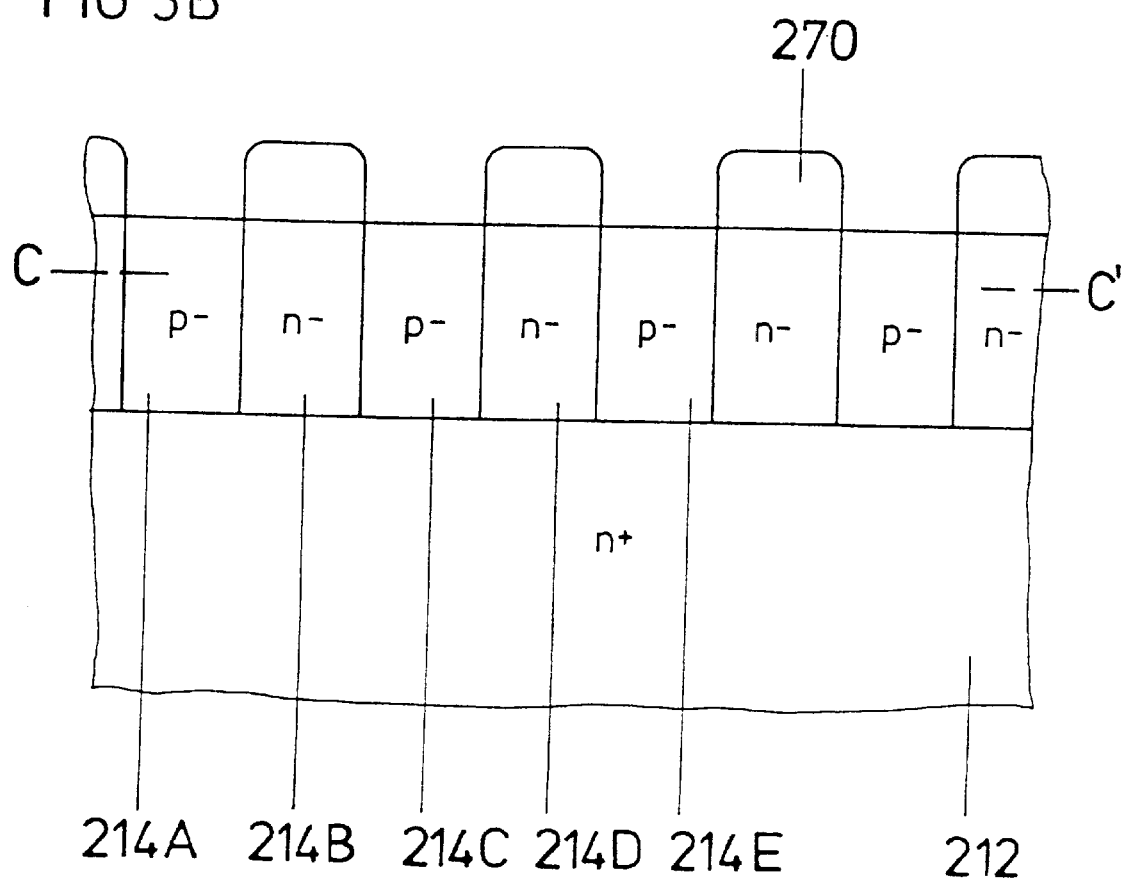
Figure 5C:
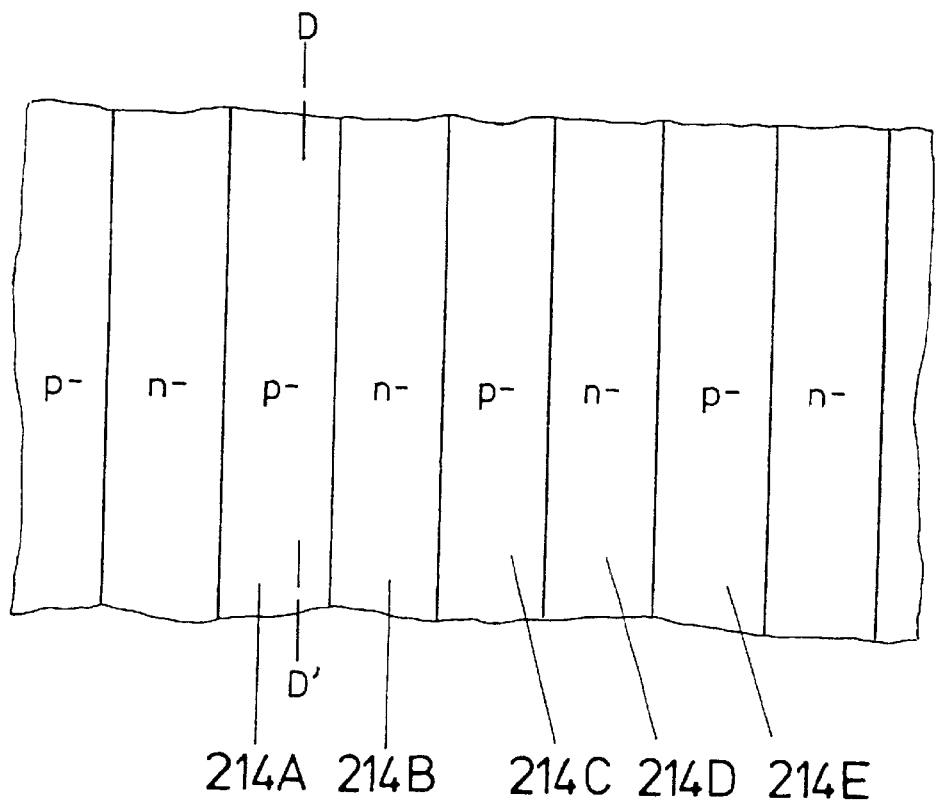

FIG. 5c shows a cross section to the configuration according to FIG. 5b in a sectional plane C–C' shown there, from which the strip-shaped configuration of the adjacent and complementarily doped zones 214A–214E of the later drift zone becomes clear.

Figure 5D:
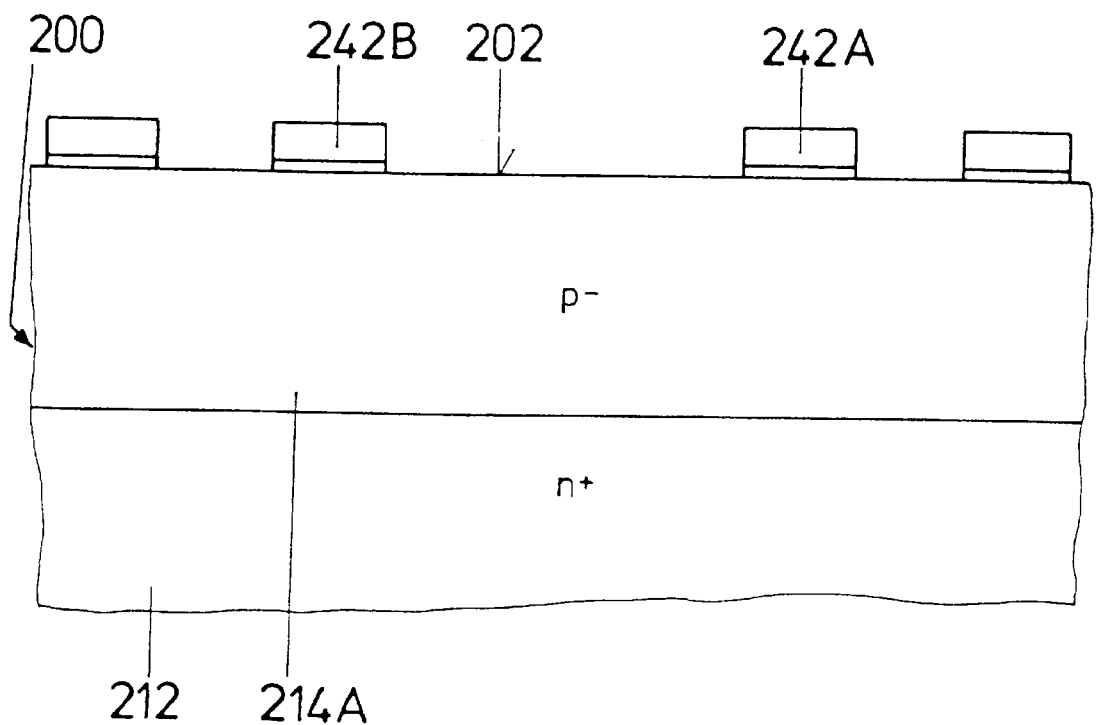

In subsequent method steps, whose result is illustrated in FIG. 5d, gate electrodes 242A, 242B, which are insulated from the semiconductor body 200 through the use of insulation layers, are applied to the front side 202 of the semiconductor body 200 in an adequately known fashion. FIG. 5d shows the configuration in cross section in a sectional plane D–D' represented in FIG. 5c, or in a view which is turned through 90° with respect to the view in FIG. 5b.

Figure 5E:
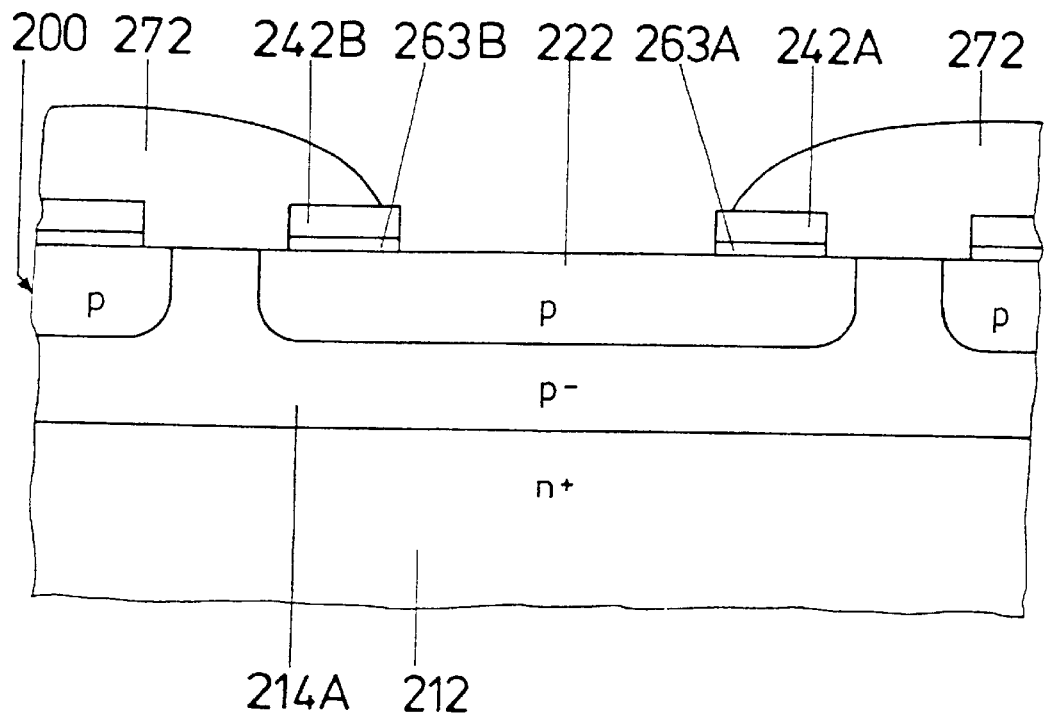
Figure 5F:
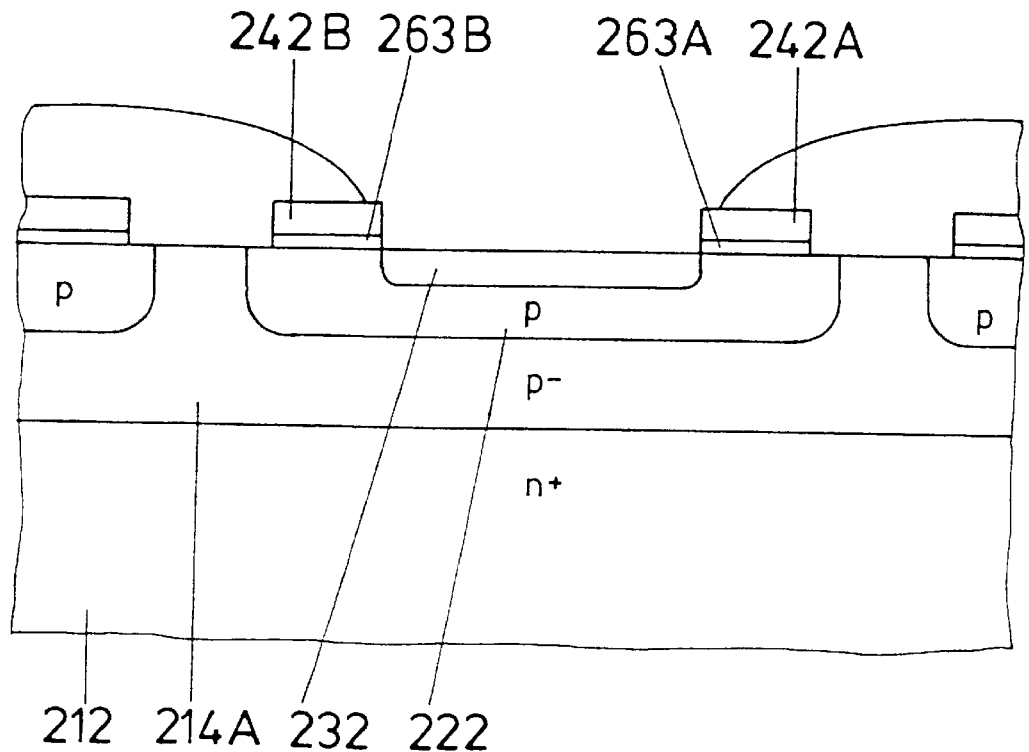

In subsequent method steps, whose result is represented in FIG. 5e, the later body zone 222 is produced. For this purpose, a protective layer 272 is applied to the front side of the semiconductor body 200, the protective layer 272 leaving exposed the regions of the semiconductor body 200 in which the later source zones are to be produced. The protective layer 272 also leaves exposed the edges of the control electrodes 242A, 242B with respect to which self-aligning manufacture of the source zones has taken place. The body zone 222 is preferably manufactured through the use of a diffusion method starting from the front side of the semiconductor body 200. The extent of the body zone 222, both in the vertical and lateral directions of the semiconductor body 200, can be adjusted through the use of the process parameters of the diffusion method in an adequately known fashion. These process parameters are, in particular, the temperature to which the semiconductor body is heated during the method, and the duration of the heating of the semiconductor body. In the present exemplary embodiment, the diffusion method was controlled in such a way that the body zone 222 "moves" completely under the gate electrodes 242A, 242B, i.e. under the insulation layer 263A, 263B, and beyond them, in the lateral direction of the semiconductor body.

Following the manufacture of the body zone 222, the source zone 232 is produced, preferably through the use of ion implantation, with self-alignment with the edges of the gate electrodes 242A, 242B which are exposed by the protective layer 272. The source zone 232 is formed here with self-alignment with the gate electrode 242A, 242B, at least in the region underneath the surface of the layer 214.

Figure 5G:
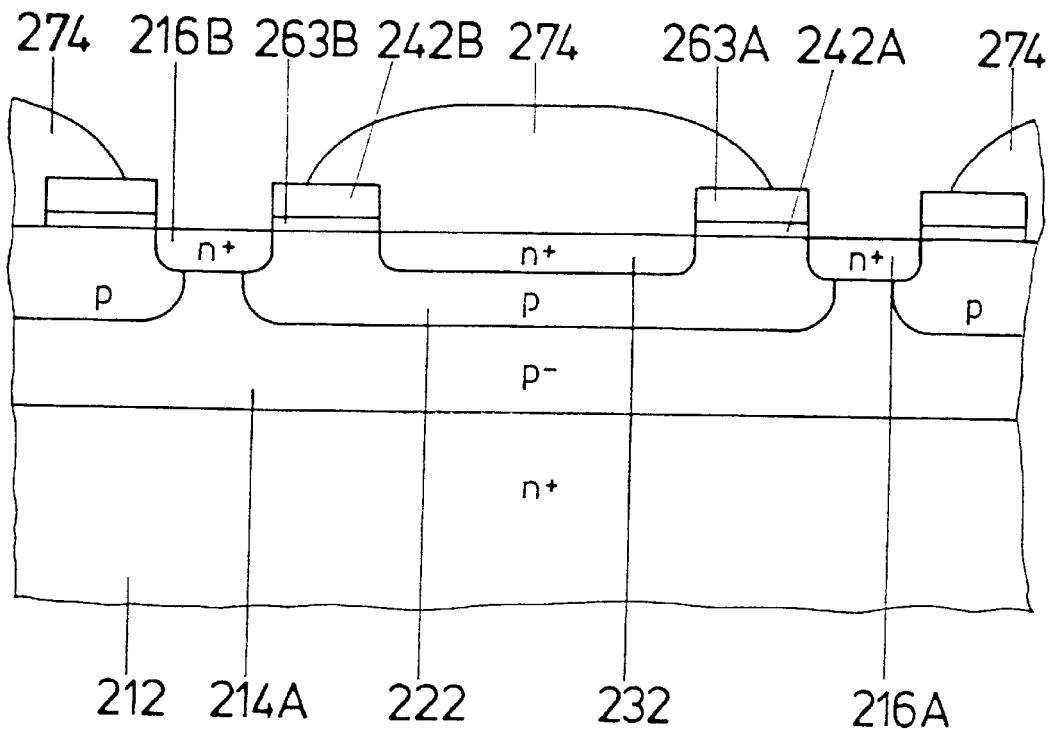

FIG. 5g shows the semiconductor component after subsequent method steps in which the heavily doped regions 216A, 216B of the drift zone 214 are manufactured. For this purpose, the protective layer 272 is removed and a new protective layer is applied to the semiconductor body, which new protective layer covers the source zone 232 and leaves exposed the edges of the control electrodes 242A, 242B which lie opposite the edges with respect to which the self-aligned manufacture of the source zone 232 has taken place. Then, heavily n-type doped zones 216A, 216B are produced in the drift zone 214A–214E with self-alignment with respect to the exposed edges of the gate electrodes 242A, 242B, through the use of ion implantation. The heavily n-type doped zones 216A, 216B of the drift zone are also produced in such a way that they are formed with self-alignment with the gate electrode 242A, 242B at least in the region underneath the surface of the layer 214.

Figure 5H:
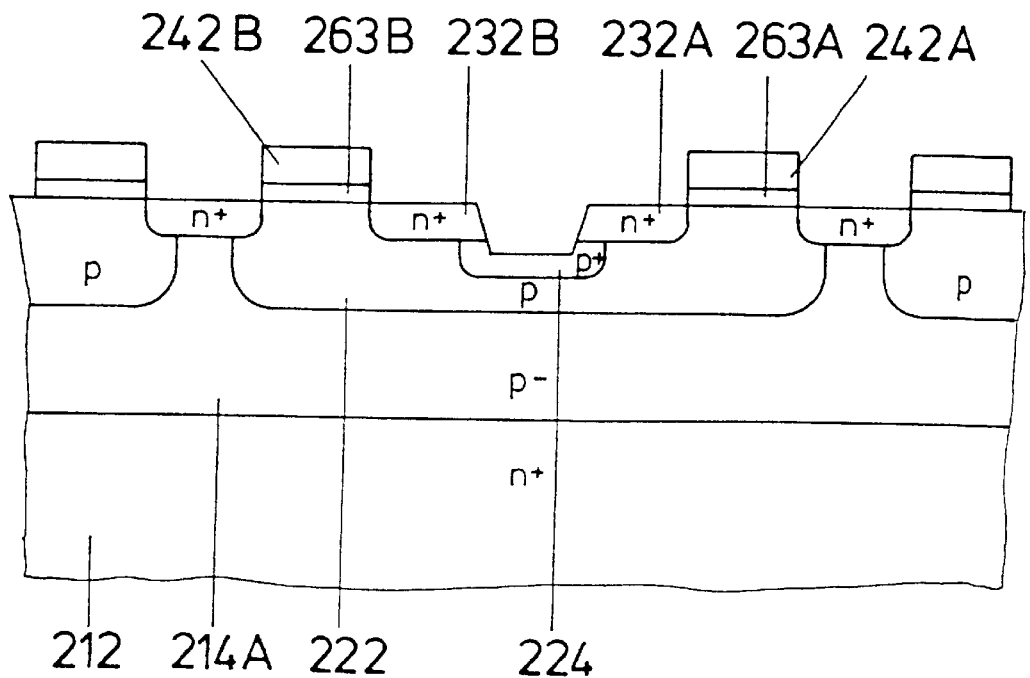

FIG. 5h shows the semiconductor component after subsequent method steps in which, after the removal of the protective layer 274, a contact hole has been produced for the later source contact, the contact hole starting from the front side of the semiconductor body and extending through the source zone 232 and into the body zone 222. P-type doping, for example through the use of a diffusion method, is then carried out at the bottom of the contact hole in order to produce the heavily p-type doped zone 224, which later surrounds the section of the source contact 252 which extends into the body zone 222.

Then, the source contact 252 which is insulated from the gate electrodes and the other regions of the semiconductor body 200 through the use of an insulation layer is manufactured in an adequately known fashion.

FIG. 6a shows a further exemplary embodiment of a semiconductor component according to the invention which differs from that illustrated in FIG. 1a in that a heavily p-type doped zone 124A is formed in the body zone 122 underneath the gate electrode 142A, 142B, but at a distance from the front side. Underneath the source zone 132A, 132B there is a further heavily p-type doped zone 124B. The heavily p-type doped zone 124A underneath the gate electrode 142A, 142B prevents a situation in which, when a voltage is applied between drain D and source S, a space charge zone extends between the drift zone 114A, 114B and the body zone 122 into the channel region which is formed underneath the gate electrode 142A, 142B and just underneath the front side 102.

Figure 6B:
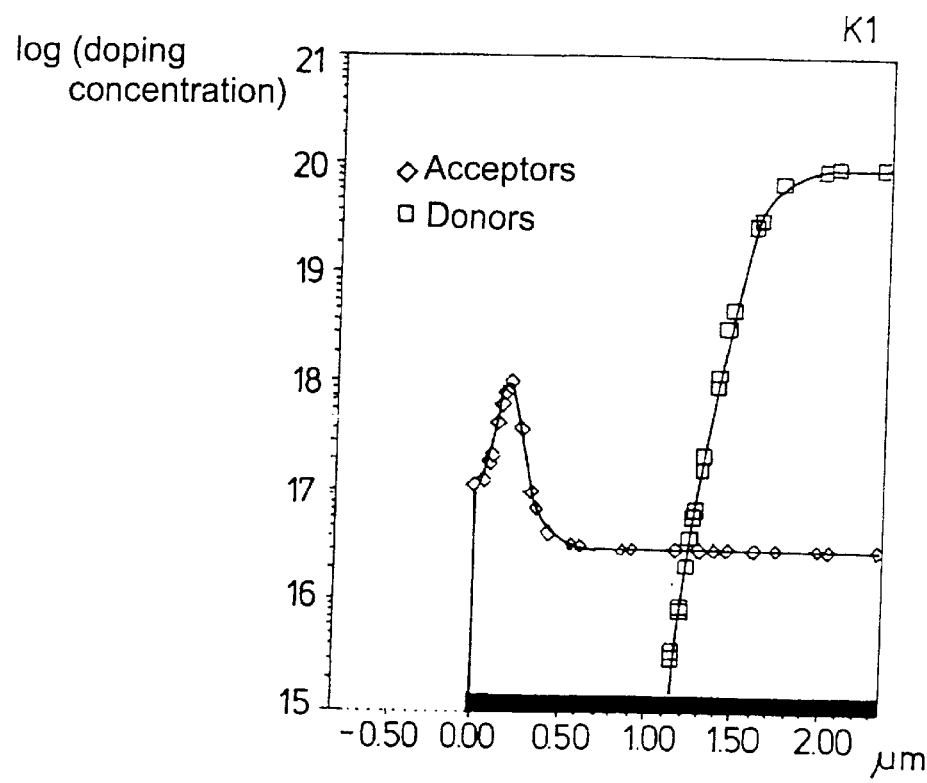

FIG. 6b shows the profile of the doping concentration along a line K1 which extends through the body zone 122, in the component according to FIG. 5a. The distance which is plotted on the right of the diagram corresponds to the profile in the vertical direction, the zero point marking the start of the semiconductor body 100 on the front side 102. The p-type doping of the body zone just underneath the front side 102 in order to form a conductive channel is approximately $10^{17}$ cm$^{-3}$ and rises to approximately $10^{18}$ cm$^{-3}$ as the depth increases in order to form the heavily doped zone 124, and then decreases to $10^{17}$ cm$^{-3}$, and less, as the depth increases further in order to form the compensation zone underneath the heavily doped zone 124. The rise in the donor concentration which occurs as the depth increases further marks the start of the drain zone 112.

Figure 6C:
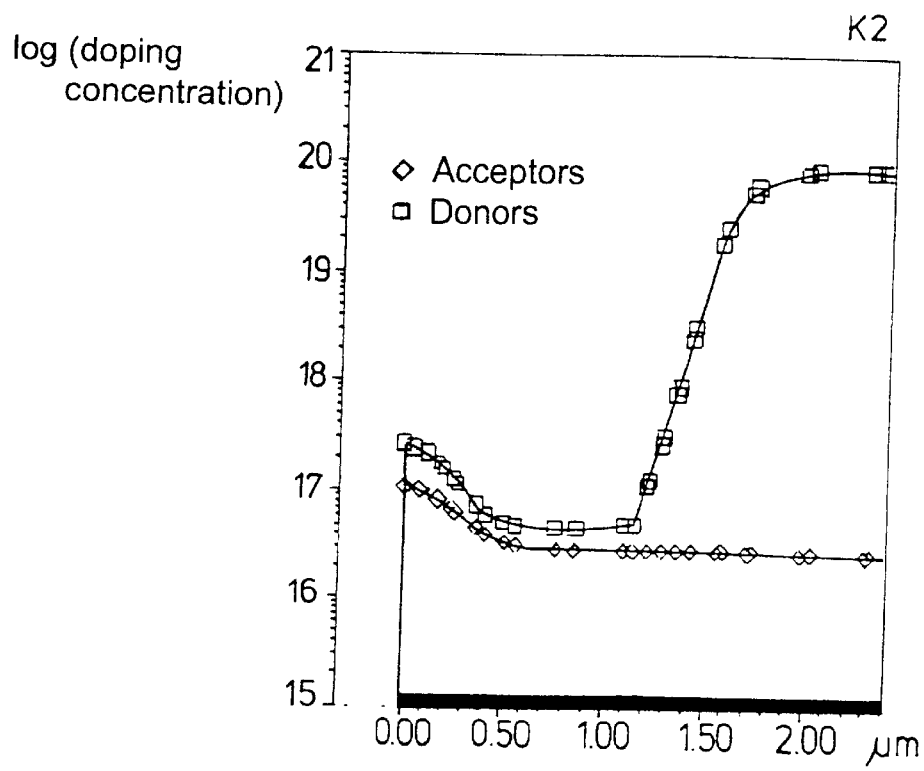

FIG. 6c shows the profile of the doping concentration along a line K2, which extends through the drift zone 114A. Here, the steep rise in the donor concentration marks the end of the drift zone 114A, and the start of the heavily doped region of the drain zone 112. The zero line marks the start of the semiconductor body 100. It is apparent that the doping concentration in the drift zone just underneath the front side is higher and is over $10^{17}$ cm$^{-3}$, and then decreases to $10^{17}$ cm$^{-3}$, and less, as the depth increases.

The heavily doped zone 124 can be manufactured, for example, through the use of an implantation method after the body zone 122 has been manufactured.

We claim:

1. A semiconductor component, comprising:
    a semiconductor body having a first side and a second side opposite said first side, said semiconductor body defining a vertical direction and a lateral direction transverse to the vertical direction, the vertical direction extending from said first side to said second side;
    said semiconductor body including a first connection zone of a first conductivity type for providing a contact at said first side of said semiconductor body;
    said semiconductor body including a second connection zone of said first conductivity type for providing a contact at said second side of said semiconductor body;
    said semiconductor body including a drift zone adjoining said first connection zone and extending in the vertical direction as far as said second side of said semiconductor body;
    said semiconductor body including a body zone of a second conductivity type disposed between said second connection zone and one of said first connection zone and said drift zone; and
    a control electrode insulated from said semiconductor body, said control electrode being disposed above said body zone such that said control electrode substantially does not overlap with said drift zone and said second connection zone in the lateral direction.

2. The semiconductor component according to claim 1, wherein:
    said drift zone and said body zone have respective regions adjoining one another; and
    said respective regions are doped such that, when a reverse voltage is applied between said first connection zone and said second connection zone, at least said drift zone is completely emptied of charge carriers.

3. The semiconductor component according to claim 1, wherein:
    said body zone has a first zone with a first doping concentration of said second conductivity type and a second zone with a second doping concentration of said second conductivity type, said first doping concentration is higher than said second doping concentration; and
    said first zone adjoins said second connection zone and said second zone.

4. The semiconductor component according to claim 1, wherein said body zone has a given zone of said second conductivity type, said given zone is disposed underneath said control electrode and at a given distance from said second side, said given zone of said second conductivity type is more heavily doped than a remainder of said body zone.

5. The semiconductor component according to claim 1, wherein:
    said drift zone has at least two adjacent zones, a first one of said at least two adjacent zones is of said first conductivity type and a second one of said at least two adjacent zones is of said second conductivity type; and
    said at least two adjacent zones extend from said first connection zone in the vertical direction of said semiconductor body toward said second side of said semiconductor body.

6. The semiconductor component according to claim 5, wherein said at least two adjacent zones of said drift zone extend as elongated zones in the lateral direction of said semiconductor body.

7. The semiconductor component according to claim 6, wherein said body zone, said second connection zone and said control electrode extend as elongated zones in a further lateral direction of said semiconductor body transverse to the lateral direction.

8. The semiconductor component according to claim 5, wherein said drift zone has a given zone of said first conductivity type, said given zone is more heavily doped than a remainder of said drift zone, said given zone adjoins said body zone and is disposed at said second side of said semiconductor body.

9. The semiconductor component according to claim 1, wherein:
    said drift zone has a plurality of respectively alternating zones of said first and second conductivity types; and
    said plurality of respectively alternating zones extend from said first connection zone in the vertical direction of said semiconductor body toward said second side of said semiconductor body.

10. A method for manufacturing a semiconductor component, the method which comprises:

provniding a semiconductor substrate of a first conductivity type in order to provide a first connection zone;

forming a layer of a second conductivity type on the semiconductor substrate;

manufacturing at least one plate-shaped control electrode on the layer of the second conductivity type such that the at least one plate-shaped control electrode is insulated from the layer of the second conductivity type;

manufacturing a drift zone of the first conductivity type such that, at least in a region of a surface of the layer of the second conductivity type, the drift zone is one of directly and indirectly self-aligned with respect to a first edge of the at least one plate-shaped control electrode and such that the drift zone extends in a vertical direction of a semiconductor body as far as the semiconductor substrate; and manufacturing a second connection zone of the first conductivity type in the layer of the second conductivity type such that, at least in a region of a surface of the layer of the second conductivity type, the second connection zone is self-aligned with respect to a second edge of the at least one plate-shaped control electrode disposed opposite the first edge.

11. The method according to claim 10, which comprises:

manufacturing a spacer at a side of the first edge of the at least one plate-shaped control electrode for manufacturing the drift zone; and manufacturing the drift zone self-aligning with respect to the spacer in a region of the layer of the second conductivity type, the region adjoining a surface of the layer.

12. The method according to claim 10, which comprises, prior to manufacturing the second connection zone, producing a doped zone of the second conductivity type in the layer of the second conductivity type, such that the doped zone is more heavily doped than a remainder of the layer of the second conductivity type.

13. The method according to claim 12, which comprises producing the doped zone by diffusing doping atoms of the second conductivity type into the layer of the second conductivity type.

14. The method according to claim 12, which comprises manufacturing the second connection zone by implanting doping atoms of the first conductivity type into the doped zone of the layer of the second conductivity type.

15. The method according to claim 10, which comprises manufacturing the drift zone by implanting doping atoms of the first conductivity type into the layer of the second conductivity type.

16. A method for manufacturing a semiconductor component, the method which comprises:

providing a semiconductor substrate of a first conductivity type in order to provide a first connection zone;

applying a layer onto the semiconductor substrate such that the layer has a given conductivity type selected from the group consisting of the first conductivity type and a second conductivity type;

manufacturing compensation zones in the layer such that the compensation zones have a conductivity type complementary to the given conductivity type of the layer and such that the compensation zones extend as far as the semiconductor substrate;

manufacturing at least one control electrode on the layer such that the at least one control electrode is insulated from the layer;

manufacturing a body zone of the second conductivity type in the layer underneath the at least one control electrode;

manufacturing a second connection zone of the first conductivity type in the body zone such that the second connection zone is one of directly and indirectly self-aligned with respect to a first edge of the at least one control electrode, at least in a region of a surface of the layer; and manufacturing a self-aligned zone of the first conductivity type in the layer such that the self-aligned zone is self-aligned with respect to a second edge opposite the first edge of the at least one control electrode, at least in a region of a surface of the layer.

17. The method according to claim 16, which comprises manufacturing the body zone by using a diffusion method.

18. The method according to claim 16, which comprises manufacturing the second connection zone by using an ion implantation process.

19. The method according to claim 16, which comprises manufacturing the self-aligned zone by using an ion implantation process.

* * * * *